United States Patent [19]

Muradliyan

[11] Patent Number: 4,748,739
[45] Date of Patent: Jun. 7, 1988

[54] ALIGNMENT TOOL

[75] Inventor: Jack A. Muradliyan, Woodland Hills, Calif.

[73] Assignee: ILC Technology, Inc., Sunnyvale, Calif.

[21] Appl. No.: 6,752

[22] Filed: Jan. 27, 1987

[51] Int. Cl.<sup>4</sup> ............................................. B23P 19/00
[52] U.S. Cl. ..................................... 29/732; 29/272; 29/464; 29/596; 29/759; 33/656
[58] Field of Search ................ 29/732, 759, 406, 596, 29/434, 464, 468, 271, 272; 310/42; 33/656, 644, 645

[56] References Cited

U.S. PATENT DOCUMENTS

| | | | |
|---|---|---|---|
| 2,568,390 | 9/1951 | Gehrke | 29/271 |
| 4,532,689 | 8/1985 | Harder et al. | 29/732 |
| 4,540,906 | 9/1985 | Blom | 29/596 |
| 4,628,592 | 12/1986 | Mahon | 310/42 |

Primary Examiner—P. W. Echols
Attorney, Agent, or Firm—Marvin H. Kleinberg; Matthew F. Jodziewicz

[57] ABSTRACT

An apparatus for use as an alignment and centering tool for providing a fixed spatial alignment between a rotor and a stator, including a base member and at least one finger member fixedly secured to the base member and extending generally therefrom. The finger member is adapted to be positioned between the rotor and the stator that are to be aligned and centered. A first releasable coupling is provided for operatively connecting the rotor and the finger member to hold the tool and the rotor in a selectively releasable, fixed spatial relationship. A second releasable coupling is also provided for operatively connecting the stator and the finger member to hold the tool and the stator in a selectively releasable, fixed spatial relationship. An alternative user-adjustable embodiment is also provided.

16 Claims, 2 Drawing Sheets

ALIGNMENT TOOL

BACKGROUND OF THE INVENTION

1. Field of the Invention

This invention relates in general to alignment and centering tools, and, more particularly, to an alignment and centering tool for use in establishing, maintaining and restoring a predetermined fixed geometry between a rotor and a stator.

2. Description of the Related Art

Optical encoders have enjoyed widespread use in a broad variety of applications. However, one of the most important maintenance and installation problems associated with optical encoders is to establish, maintain or restore a predetermined fixed spatial relationship between the encoder rotor and the stator housing of the optical encoder, so that the optical alignment between the spinning encoder disk and the optically active reading circuitry is correct and proper. Whenever the proper alignment between these two mechanically interacting elements is lost, the ability of the optical reading circuitry to correctly interpert the spinning encoded disk is adversely affected, resulting in a consequent failure of the optical encoder to perform optimally its designed function.

Misalignment of the rotor and the stator in an optical encoder is commonplace due to a wide variety of factors, some of which are inherent in the mechanical interaction of a spinning disk and a stationary housing. Some of these factors are tightening screws loosened by mechanical vibration, shock induced stress forces from movement of the optical encoder in shipping, and the general wear and tear occasioned by inertial forces caused by a spinning disk which is subjected to acceleration and deceleration as it controls the movement and positioning of associated elements.

To date the prior art has consisted of requiring maintenance personnel to employ various alignment devices such as lasers, levels and calipers to align a rotor with respect to its stator housing to manufacturer's published tolerances. As a result of using a number of alignment devices, and the varying individual ability of the maintenance personnel, the procedure is both time consuming, costly and is likely to produce non-uniform results.

Thus, during the life cycle of a device having a rotor and a stator, such as an optical encoder having a disc and a photohead, these moving mechanical parts are aligned several times by different people with different skills and with different tools. For example, calibration at the factory usually includes laser positioning of the moving elements; final inspection at the quality assurance section of the factory is usually a visual inspection; incoming inspection at the customer's location is usually another visual inspection; and finally, installation at the customer site generally relies on available equipment and the ability of the installation personnel.

With the present invention, the above alignment procedures are reduced to one manual adjustment at the factory by experienced personnel. Three subsequent adjustments using the tool of the present invention provides for superior reliability over the prior art method and tools.

The present invention provides a single alignment and centering device that quickly and uniformly produces the correct alignment and centering tolerances required by the manufacturer while eliminating errors caused by the complexity of the alignment procedure or the inexperience of the maintenance personnel.

SUMMARY OF THE INVENTION

It is an object of the present invention to provide an alignment and centering apparatus for use in producing a predetermined fixed spatial relationship between a rotor and a stator.

It is another object of the present invention to provide an alignment and centering apparatus for use with an optical encoder to produce a uniform, predetermined fixed geometry between the rotor and the stator of the optical encoder rapidly. Such an apparatus is easy to use and inexpensive to manufacture.

It is yet another object of the present invention to provide an alignment and centering apparatus for use with an optical encoder, or the like device, that is adjustable by the user to choose a fixed geometry between the rotor and the stator and then maintain this chosen fixed geometry for future alignment and centering maintenance operations.

It is still another object of the present invention to provide an alignment and centering apparatus for use in aligning and centering any rotating body with regard to the housing in which it is contained.

In summary, this invention provides an apparatus for use as an alignment and centering tool to establish a fixed spatial alignment between a rotor and a stator. The device includes a base member and at least one finger member fixedly secured to the base member and extending generally therefrom. The finger member is adapted to be positioned between the rotor and the stator that are to be aligned and centered.

First releasable coupling means are provided for operatively connecting the rotor and the finger member to hold the tool and the rotor in a selectively releasable, fixed spatial relationship. Second releaseable coupling means are also provided for operatively connecting the stator and the finger member to hold the tool and the stator in a selectively releasable, fixed spatial relationship.

This invention also provides an alternative apparatus for use as an alignment and centering tool that can be adjusted by the user for providing a fixed spatial alignment between a rotor and a stator. The alternative apparatus includes a first base member and at least one, first finger member fixedly secured at one end proximate the periphery of the first base member and having an opposite end extending generally therefrom.

First releasable coupling means are provided for operatively connecting the rotor and the first finger member to hold the first base member and the rotor in a selectively releasable, fixed spatial relationship. A second base member has a hole adapted to slideably receive therethrough the first finger member and, further, has at least one, second finger member fixedly secured at one end proximate the periphery of the second base member which has its opposite end extending generally therefrom.

Second releasable coupling means are provided for operatively connecting the stator and the second finger member to hold the second base member and the stator in a selectively releasable, fixed spatial relationship. Means for selectively preventing movement of the first and the second base members relative to one another are provided.

In operation, the device of the invention is used by aligning the finger members for insertion between a gap formed between the rotor and the stator. The device is then pushed downward into the gap until the first and second coupling means are engaged to the rotor and to the stator respectively. Once engaged, the spatial relationship between the rotor and the stator is held fixed to a pre-determined standard.

The novel features of construction and operation of the invention will be more clearly apparent during the course of the following description, reference being had to the accompanying drawings wherein has been illustrated a preferred form of the device of the invention and wherein like characters of reference designate like parts throughout the drawings.

DESCRIPTION OF THE PREFERRED EMBODIMENTS

Figure 1:
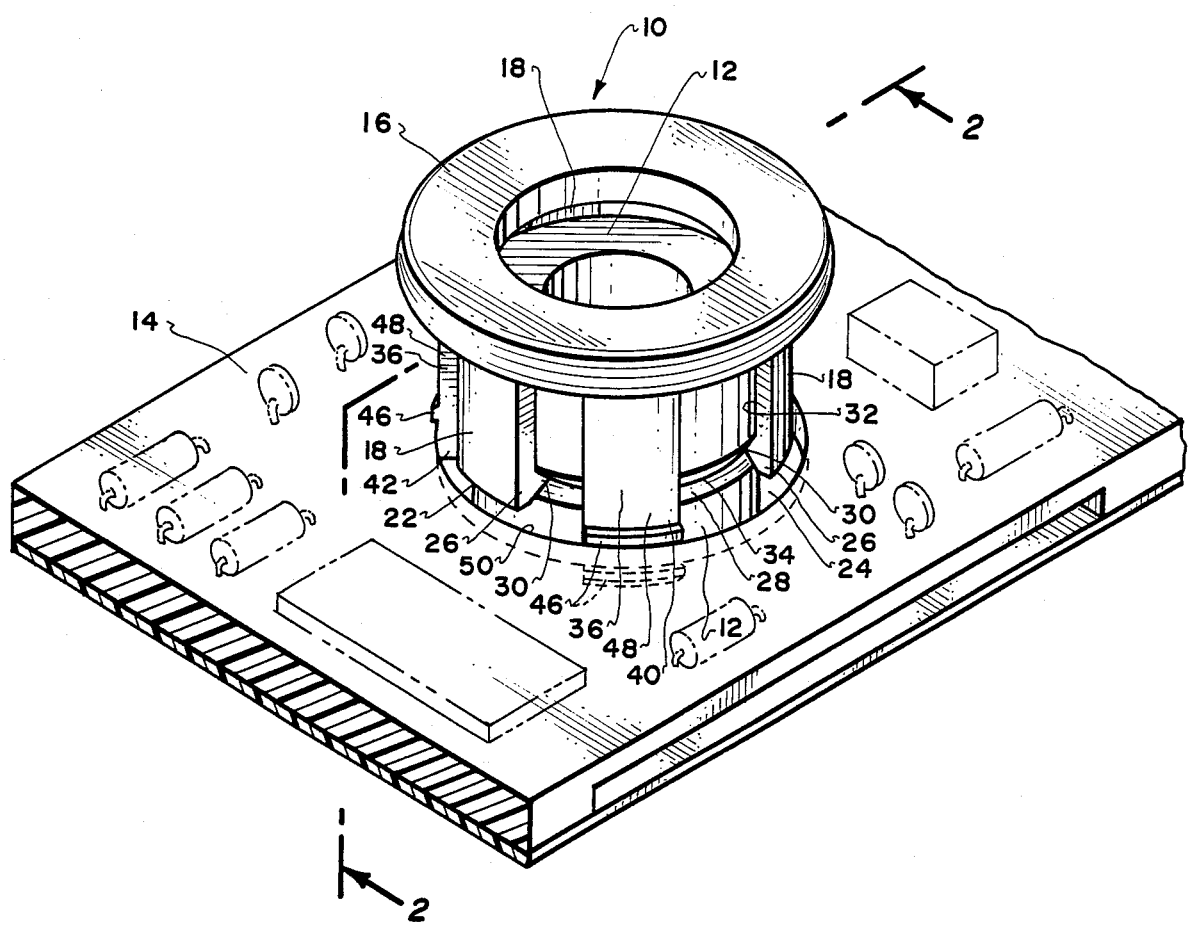
FIG. 1 is a perspective view showing an alignment and centering apparatus constructed in accordance with the present invention and how it is used with an optical encoder.

Turning first to FIG. 1, there is shown an alignment and centering device embodying the present invention for providing a fixed spatial alignment and centering between a rotor 12 and a stator 14 (here shown to be the stationary portion of a housing containing rotor 12) is generally referred to by the reference arrow 10.

The apparatus 10 includes a base member 16, shown to be a flat annular ring shaped body in the preferred embodiment of the apparatus 10 in the figures. First finger members 18 are fixedly secured at one end 20 to the base member 16 and have an opposite end 22 extending generally therefrom. The first finger members 18 are adapted to be positioned in the gap 24 between the rotor 12 and the stator 14.

A first mating element 26 is formed on each of the first finger members 18 intermediate the ends 20 and 22 and is adapted to releasably engage a corresponding mating element 28 on the rotor 12. First mating element 26 is preferably an inwardly directed protuberance 30 formed on side wall 32 of the first finger members 18 and the corresponding mating element 28 is a receptacle or, preferably a circumferential channel 34 formed in the rotor 12. Both protuberance 30 and channel 34 are adapted to be releasably snap-fitted together to provide a fixed spatial relationship between the first finger members 18 (and thereby the base member 16) and the rotor 12.

Accordingly, both first mating element 26 and corresponding mating element 28 provide first releasable coupling means operatively connecting the rotor 12 and the first finger members 18 for holding the apparatus 10 and the rotor 12 in a selectively releasable, fixed spatial relationship.

Second finger members 36 are fixedly secured at one end 38 to the base member 16 and have an opposite end 40 extending generally therefrom. The second finger members 36 are adapted to be positioned in the gap 24 between the rotor 12 and the stator 14.

A second mating element 42 is formed on each of the second finger members 36 intermediate the ends 38 and 40, and is adapted to releasably engage a corresponding mating element 44 on the stator 14. Second mating element 42 is preferably a pair of protuberances 46 formed on side wall 48 of the second finger members 36 forming a channel 50 therein, and the corresponding mating element 44 is a protruding annular portion 52 of the stator 14. Channel 50 is adapted to releasably engage therein protruding portion 52 of the stator 14 in a close fitting relationship to provide a fixed spatial relationship between the second finger members 36 (and thereby the base member 16) and the stator 14.

Accordingly, both second mating element 42 and corresponding mating element 44 provide second releasable coupling means operatively connecting the stator 14 and the second finger members 36 in a selectively releasable, fixed spatial relationship.

In general, there must be at least one of each of the first and second finger members 18 and 36 respectively in this described preferred embodiment, although three each equally spaced first and second finger members 18 and 36, fixedly secured to the base member 16 proximate its periphery, are the better arrangement to provide a more secure and stable connection between the apparatus 10 and the rotor 12 and the stator 14.

An alternative embodiment of the present invention would include having only a single set of finger members each of which has both the first and second releasable coupling means on opposite side walls so that each of the finger members would engage both the rotor 12 and the stator 14 in a manner similar to that described above.

Figure 2:
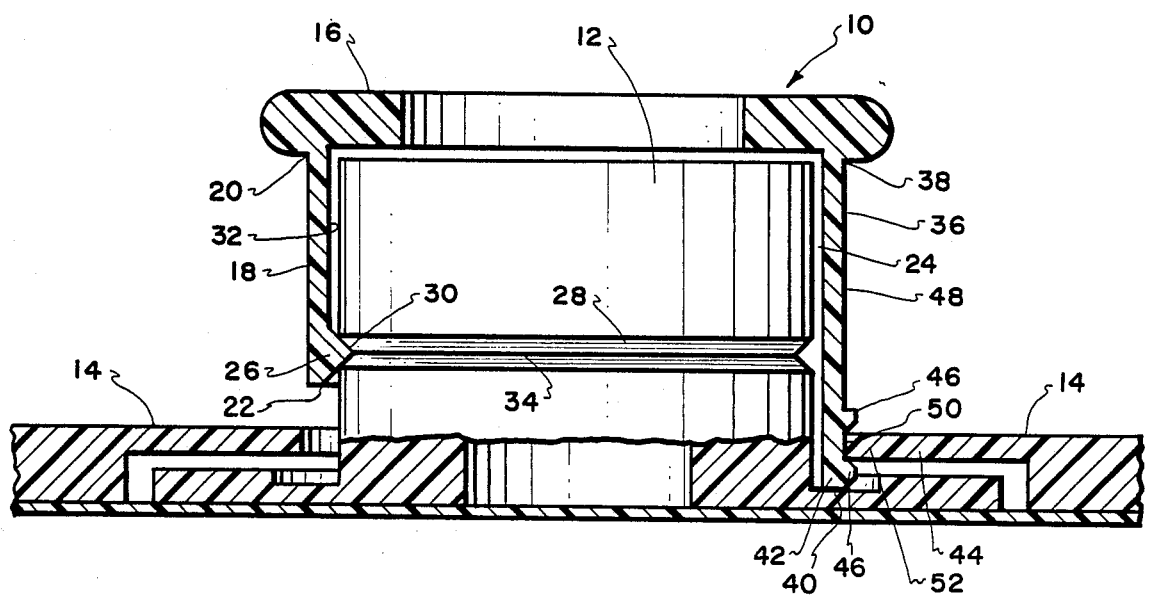
FIG. 2 is a view taken along the line 2—2 of FIG. 1 in the direction of the appended arrows.
Figure 2A:
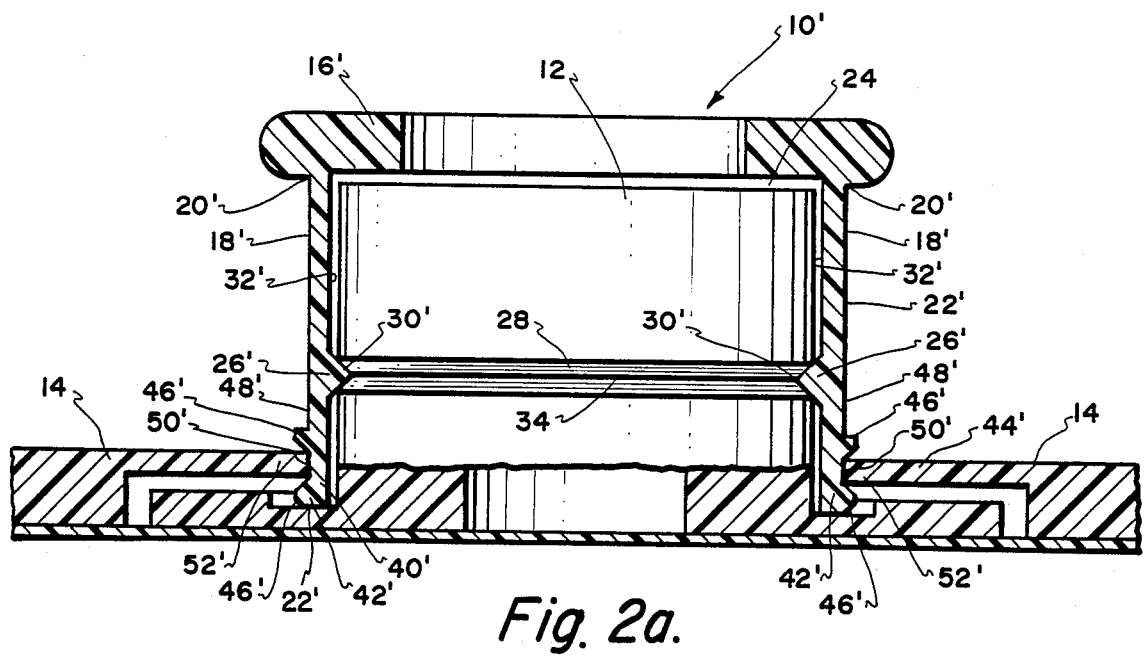
FIG. 2a is a view similar to FIG. 2 showing an alternative alignment and centering apparatus constructed in accordance with the present invention.

Specifically, with reference to FIG. 2a, (in which similar elements to those of FIG. 2 are identified by similar reference numerals, supercripted by a "prime"), the apparatus 10' includes a base member 16', shown to be a flat annular ring shaped body in the preferred embodiment of the apparatus 10' in FIG. 2a. Finger members 18' are fixedly secured at one end 20' to the base member 16' and have an opposite end 22' extending generally therefrom. The finger members 18' are adapted to be positioned in the gap 24' between the rotor 12 and the stator 14.

A first mating element 26' is formed on each of the finger members 18' intermediate the ends 20' and 22' and is adapted to releasably engage a corresponding mating element 28' on the rotor 12. First mating element 26' is preferably an inwardly directed protuberance 30' formed on side wall 32' of the finger members 18' and the corresponding mating element 28' is a receptacle or, preferably a circumferential channel 34' formed in the rotor 12. Both protuberance 30' and channel 34' are adapted to be releasably snap-fitted together to provide a fixed spatial relationship between the finger members 18' (and thereby the base member 16') and the rotor 12.

Accordingly, both first mating element 26' and corresponding mating element 28' provide first releasable coupling means operatively connecting the rotor 12 and the first finger members 18' for holding the apparatus 10' and the rotor 12 in a selectively releasable, fixed spatial relationship.

A second mating element 42' is formed on each of the finger members 18' intermediate the ends 20' and 22', and is adapted to releasably engage a corresponding mating element 44' on the stator 14. Second mating element 42' is preferably a pair of protuberances 46' formed on side wall 48' of the finger members 18' opposite to side wall 32', forming a channel 50' therein, and the corresponding mating element 44' is a protruding annular portion 52' of the stator 14. Channel 50' is adapted to releasably engage therein protruding portion 52' of the stator 14 in a close fitting relationship to provide a fixed spatial relationship between the finger members 18' (and thereby the base member 16') and the stator 14.

Accordingly, both second mating element 42' and corresponding mating element 44' provide second releasable coupling means operatively connecting the stator 14 and the finger members 18' in a selectively releasable, fixed spatial relationship.

In general, there must be at least one of each of the finger members 18' in this described preferred embodiment, although three equally spaced finger members 18', fixedly secured to the base member 16' proximate its periphery, are the better arrangement to provide a more secure and stable connection between the apparatus 10' and the rotor 12 and the stator 14.

The first above described preferred embodiment of the present invention is used with devices having a stator 14 and a rotor 12 by positioning the finger members 18 and 36 of the alignment and centering tool 10 into a mating groove on the rotor 12 (the circumferential channel 34 shown in FIG. 2), and to a protruding annular portion 52 of the stator 14 respectively, to fixedly engage the tool 10 to both the rotor 12 and the stator 14. Once the tool 10 is placed in position it is installed by pushing the base member 16 uniformly downward toward the rotor 12 and the stator 14 until both the first and second finger members 18 and 36 are engaged with their respective mating elements. Similarly, the tool 10 is removed from its engagement by pulling the base member 16 outward from the rotor 12 and stator 14, once the rotor is fixedly attached to the structure at the desired spatial separation from the stator and housing. The above described alternative device is used similarly.

Since the first and second finger members 18 and 36 are both structurally rigidly connected to one another via the base member 16 and represent a predetermined fixed relationship between the rotor 12 and the stator 14, the use of the alignment and centering tool 10 provides and transfers this fixed relationship to the rotor 12 and the stator 14.

The alignment and centering tool 10 can be used several times for the same purpose on the same rotor 12 and stator 14, or it can be used to align and center different rotors and stators to the same spatial standards.

Figure 3:
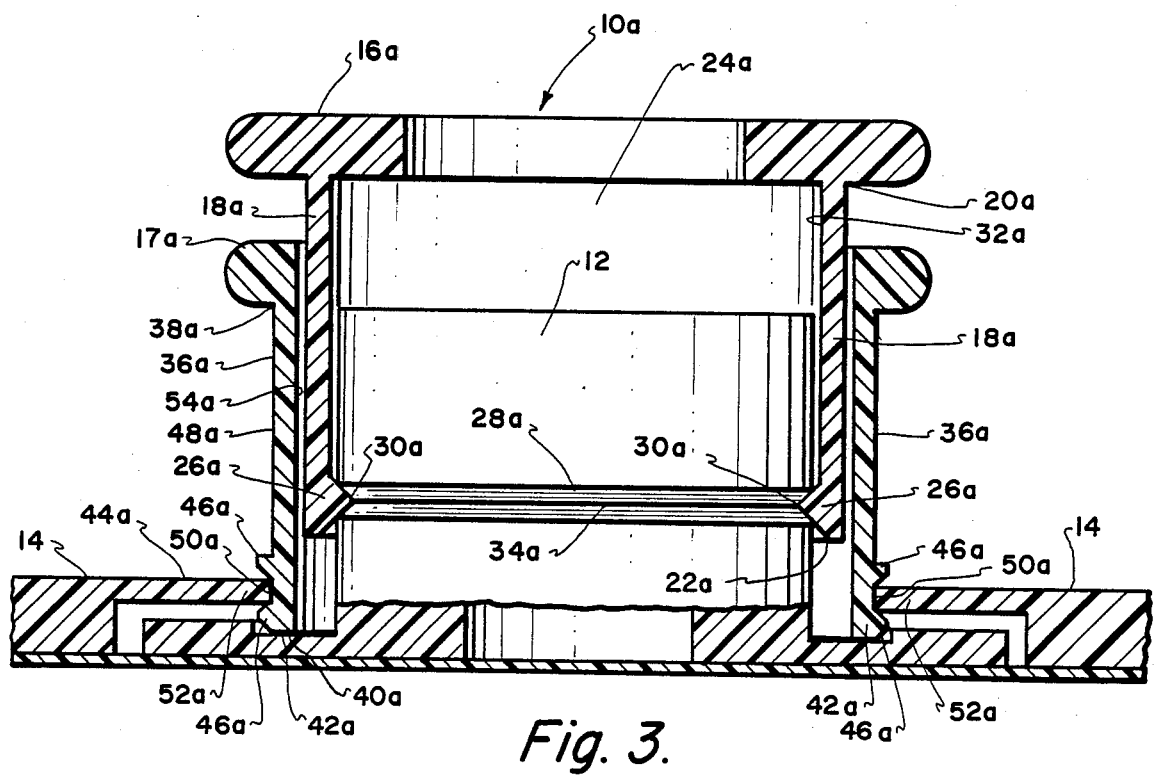
FIG. 3 is a view similar to that of FIG. 2 showing an alternative alignment and centering apparatus constructed in accordance with the present invention.

A second alternative embodiment of an alignment and centering tool constructed in accordance with the present invention for providing a fixed spatial alignment between a rotor 12 and a stator 14 is shown in FIG. 3 in which similar elements to those of FIGS. 1 and 2 are identified by similar reference numerals, subscripted by the letter "a".

The apparatus is generally referred to by the reference arrow 10a and includes a first base member 16a, shown to be a flat annular ring shaped body in the preferred embodiment of the apparatus 10a shown in FIG. 3.

First finger members 18a are fixedly secured at one end 20a to the first base member 16a and have an opposite end 22a extending generally therefrom. The first finger members 18a are adapted to be positioned in the gap 24 between the rotor 12 and the stator 14.

A first mating element 26a is formed on each of the first finger members 18a intermediate the ends 20a and 22a and is adapted to releasably engage a corresponding mating element 28a on the rotor 12.

First mating element 26a is preferably an inwardly directed protuberance 30a formed on side wall 32a of the first finger members 18a and the corresponding mating element 28a is a receptacle or, preferably a circumferential channel 34a formed in the rotor 12. Both protuberance 30a and channel 34a are adapted to be releasably snap-fitted together to provide a fixed spatial relationship between the first finger members 18a (and thereby the first base member 16a) and the rotor 12.

Accordingly, both first mating element 26a and corresponding mating element 28a provide first releasable coupling means operatively connecting the rotor 12 and the first finger members 18a for holding the first base member 16a and the rotor 12 in a selectively releasable, fixed spatial relationship.

A second base member 17a has a hole 54a adapted to slidably receive therethrough the first finger members 18a as shown in FIG. 3.

Second finger members 36a are fixedly secured at one end 38 a to the second base member 17a and have an opposite end 40a extending generally therefrom. The second finger members 36a are adapted to be positioned in the gap 24 between the rotor 12 and the stator 14.

A second mating element 42a is formed on each of the second finger members 36a intermediate the ends 38a and 40a, and is adapted to releasably engage a corresponding mating element 44a on the stator 14.

Second mating element 42a is preferably a pair of protuberances 46a formed on side walls 48a of the second finger members 36a forming a channel 50a therein, and the corresponding mating element 44a is a protruding annular portion 52a of the stator 14. Channel 50a is adapted to releasably engage therein protruding portion 52a of the stator 14 in a close fitting relationship to provide a fixed spatial relationship between the second finger members 36a (and thereby the second base member 17a) and the stator 14.

Accordingly, both second mating element 42a and corresponding mating element 44a provide second releasable coupling means operatively connecting the stator 14 and the second finger members 36a in a selectively releasable, fixed spatial relationship.

In general, there must be at least one of each of the first and second finger members 18a and 36a respectively in this described preferred embodiment, although three each equispaced first and second finger members 18a and 36a, fixedly secured to the first and second base members 16a and 17a respectively, proximate their peripheries, are the better arrangement to provide a more secure and stable connection between the apparatus 10a and the rotor 12 and the stator 14.

This alternative preferred embodiment of an alignment and centering tool 10a operates on the same general principles described above for the use of the first described preferred embodiment. The main difference in its operation is that instead of providing a fixed alignment between the rotor 12 and the stator 14, this alternative embodiment provides a predetermined amount of spatial adjustment in the x, y, and z-axis directions. Thus this alternative embodiment may be used for optimizing the relationship between the stator 14 and the rotor 12 or correcting for some manufacturing tolerances that may vary with each unit or batch of devices containing the rotor and stator that are to be aligned and centered.

It can also be used to accommodate for slightly different requirements placed on different usages of a product.

Specifically, this alternative embodiment of the tool is used by engaging the first finger members 18a of the tool 10a to the stator 14 first. Next, through the hole 54a in second base member 17a finger members 36a are inserted and pushed downward until the second finger members 36a engage into the groove or circumferential channel 34 formed on the rotor 12 which has been provided by the manufacturer for alignment purposes.

Next, the rotor 12 and the stator 14 are aligned with respect to each other using conventional methods, that is, precision shims, comparator, calipers, etc.

While this alignment is in process the first and the second base members 16a and 17a respectively engaged to the rotor 12 and the stator 14. The rotor 12 is now rotated to confirm that the alignment performed has satisfied the requirements. Thereafter, a quick drying adhesive is injected between the first and the second base members 16a and 17a, respectively.

The adhesive fixes the spatial relationship (geometry) between the first and the second base members 16a and 17a respectively, thus providing a fixed geometry between the rotor 12 and the stator 14.

After this process, the rotor 12 and the stator 14 can be disassembled and re-assembled as required for shipping, installation, maintenance, etc., and, with the use of the adhesively stabilized tool, the spatial relationship between the rotor 12 and the stator 14 can be re-established to the required geometric relationship as and when so desired.

The invention described above is, of course, susceptible to many variations, modifications and changes, all of which are within the skill of the art. It should be understood that all such variations, modifications and changes are within the spirit and scope of the invention and of the appended claims. Similarly, it will be understood that it is intended to cover all changes, modifications and variations of the example of the invention herein disclosed for the purpose of illustration which do not constitute departures from the spirit and scope of the invention.

What is claimed is:

1. An alignment tool for providing a fixed spatial alignment between a rotor and a stator, the tool comprising:
    a base member;
    at least one finger member fixedly secured to said base member and extending generally therefrom, said finger member adapted to be positioned between the rotor and the stator;
    first releasable coupling means operatively connecting the rotor and said finger member for holding the tool and the rotor in a selectively releasable, fixed spatial relationship; and
    second releasable coupling means operatively connecting the stator and said finger member for holding the tool and the stator in a selectively releasable, fixed spatial relationship.

2. An alignment tool for providing a fixed spatial alignment between a rotor and a stator as in claim 1 wherein said first releasable coupling means comprises a first mating element on said finger member intermediate the ends of said finger member adapted to releasably engage a corresponding mating element on the rotor.

3. An alignment tool for providing a fixed spatial alignment between a rotor and a stator as in claim 2 wherein said first mating element is a protuberance on said finger member and said corresponding mating element is a receptacle formed on the rotor, said protuberance adapted to be releasably snap-fitted into said receptacle.

4. An alignment tool for providing a fixed spatial alignment between a rotor and a stator as in claim 1 wherein said second releasable coupling means comprises a second mating element on said finger member adapted to releasably engage in a close fitting relationship, a portion of the stator.

5. An alignment tool for providing a fixed spatial alignment between a rotor and a stator as in claim 4 wherein said second mating element is a receptacle formed on said finger member.

6. An alignment tool for providing a fixed spatial alignment between a rotor and a stator, the tool comprising:
    a base member;
    at least one, first finger member, fixedly secured at one end to said base member and having an opposite end extending generally therefrom, said first finger member adapted to be positioned between the rotor and the stator;
    first releasable coupling means operatively connecting the rotor and said first finger member for holding the tool and the rotor in a selectively releasable, fixed spatial relationship;
    at least one, second finger member, fixedly secured at one end to said base member and having an opposite end extending generally therefrom, said second finger member adapted to be positioned between the rotor and the stator;
    second releasable coupling means operatively connecting the stator and said second finger member in a selectively releasable, fixed spatial relationship.

7. An alignment tool for providing a fixed spatial alignment between a rotor and a stator as in claim 6 wherein said first releasable coupling means comprises a first mating element on said first finger member intermediate the ends of said first finger member adapted to releasably engage a corresponding mating element on the rotor.

8. An alignment tool for providing a fixed spatial alignment between a rotor and a stator as in claim 7 wherein said first mating element is a protuberance on said first finger member and said corresponding mating element is a receptacle formed on the rotor, said protuberance adapted to be releasably snap-fitted into said receptacle.

9. An alignment tool for providing a fixed spatial alignment between a rotor and a stator as in claim 6 wherein said second releasable coupling means comprises a second mating element on said second finger member adapted to releasably engage in a close fitting relationship, a portion of the stator.

10. An alignment tool for providing a fixed spatial alignment between a rotor and a stator as in claim 9 wherein said second mating element is a receptacle formed on said second finger member.

11. An alignment tool for providing a fixed spatial alignment between a rotor and a stator as in claim 6 wherein said first and said second finger members are each fixedly secured at one end proximate the periphery of said base member and are equispaced around the periphery of said base member.

12. An alignment tool for providing a fixed spatial alignment between a rotor and a stator, the tool comprising:

a first base member;

at least one, first finger member fixedly secured at one end proximate the periphery of said first base member and having an opposite end extending generally therefrom;

first releasable coupling means operatively connecting the rotor and said first finger member for holding said first base member and the rotor in a selectively releasable, fixed spatial relationship;

a second base member having a hole adapted to slideably receive therethrough said first finger member and having at least one, second finger member fixedly secured at one end proximate the periphery of said second base member and having an opposite end extending generally therefrom;

second releasable coupling means operatively connecting the stator and said second finger member for holding said second base member and the stator in a selectively releasable, fixed spatial relationship; and means for selectively preventing movement of said first and said second base members relative to one another.

13. An alignment tool for providing a fixed spatial alignment between a rotor and a stator as in claim 12 wherein said first releasable coupling means comprises a first mating element on said first finger member intermediate the ends of said first finger member adapted to releasably engage a corresponding mating element on the rotor.

14. An alignment tool for providing a fixed spatial alignment between a rotor and a stator as in claim 13 wherein said first mating element is a protuberance on said first finger member and said corresponding mating element is a receptacle formed on the rotor, said protuberance adapted to be releasably snap-fitted into said receptacle.

15. An alignment tool for providing a fixed spatial alignment between a rotor and a stator as in claim 12 wherein said second releasable coupling means comprises a second mating element on said second finger member adapted to releasably engage in a close fitting relationship, a portion of the stator.

16. An alignment tool for providing a fixed spatial alignment between a rotor and a stator as in claim 15 wherein said second mating element is a receptacle formed on said second finger member.

* * * * *